US012796530B2

(12) United States Patent
Park et al.

(10) Patent No.: US 12,796,530 B2
(45) Date of Patent: Nov. 10, 2026

(54) SEMICONDUCTOR PACKAGE AND METHOD OF FABRICATING THE SAME

(71) Applicant: Samsung Electronics Co., Ltd., Suwon-si (KR)

(72) Inventors: Jin-Woo Park, Suwon-si (KR); Un-Byoung Kang, Suwon-si (KR); Chungsun Lee, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 419 days.

(21) Appl. No.: 18/213,851

(22) Filed: Jun. 25, 2023

(65) Prior Publication Data

US 2024/0120251 A1 Apr. 11, 2024

(30) Foreign Application Priority Data

Oct. 7, 2022 (KR) ........................ 10-2022-0128997
Dec. 27, 2022 (KR) ........................ 10-2022-0186228

(51) Int. Cl.

*H10W 74/10* (2026.01)
*H10W 74/01* (2026.01)

(Continued)

(52) U.S. Cl.

CPC ......... *H10W 74/131* (2026.01); *H10W 74/01* (2026.01); *H10W 90/00* (2026.01);

(Continued)

(58) Field of Classification Search

CPC .. H10W 74/131; H10W 74/01; H01L 23/481; H01L 25/18

See application file for complete search history.

(56) References Cited

U.S. PATENT DOCUMENTS 7,151,009 B2 * 12/2006 Kim ...................... H10W 20/20 257/E21.705
7,667,333 B2 * 2/2010 Singleton .............. H10W 72/90 257/E23.116

(Continued)

FOREIGN PATENT DOCUMENTS

CN 110943061 A * 3/2020 ............ H10W 90/00
CN 110943061 B * 12/2024 ............ H10W 90/00

(Continued)

*Primary Examiner* — Laura M Menz

(74) *Attorney, Agent, or Firm* — Muir Patent Law, PLLC

(57) ABSTRACT

Disclosed are semiconductor packages and their fabrication methods. The semiconductor package comprises a base semiconductor chip, a chip structure on the base semiconductor chip, a connection terminal between the base semiconductor chip and the chip structure, and a molding layer surrounding the chip structure and the connection terminal. The chip structure includes a first semiconductor chip including a first frontside pad and a first backside pad, and a second semiconductor including a second frontside pad and a second backside pad. A lateral surface of the first semiconductor chip is aligned with that of the second semiconductor chip. The first backside pad and the second frontside pad partially overlap each other when viewed in plan while being in direct contact with each other. The first backside pad and the second frontside pad include the same metal and are formed into a single unitary piece.

20 Claims, 10 Drawing Sheets

(51) Int. Cl.

| | |
|---|---|
| ***H10W 90/00*** | (2026.01) |
| *H10B 80/00* | (2023.01) |
| *H10W 72/00* | (2026.01) |
| *H10W 72/20* | (2026.01) |
| *H10W 74/15* | (2026.01) |

(52) U.S. Cl.

CPC ........... *H10B 80/00* (2023.02); *H10W 72/072* (2026.01); *H10W 72/07232* (2026.01); *H10W 72/07254* (2026.01); *H10W 72/073* (2026.01); *H10W 72/247* (2026.01); *H10W 74/15* (2026.01); *H10W 90/722* (2026.01); *H10W 90/732* (2026.01); *H10W 90/792* (2026.01)

(56) References Cited

U.S. PATENT DOCUMENTS

| | | | | |
|---|---|---|---|---|
| 7,973,310 | B2 * | 7/2011 | Wang | H10W 20/20 257/E21.597 |
| 8,143,710 | B2 * | 3/2012 | Cho | H10W 90/00 257/784 |
| 8,154,135 | B2 * | 4/2012 | Kim | H10D 62/117 257/692 |
| 8,513,802 | B2 * | 8/2013 | Ma | H10W 74/012 257/734 |
| 8,803,325 | B2 * | 8/2014 | Kim | H10W 20/49 257/774 |
| 9,184,153 | B2 * | 11/2015 | Lu | H10W 72/0198 |
| 9,263,422 | B2 | 2/2016 | Droege et al. | |
| 9,653,430 | B2 | 5/2017 | Kim et al. | |
| 9,812,425 | B2 * | 11/2017 | Cheah | H10W 20/20 |
| 10,023,775 | B2 * | 7/2018 | Kawamoto | C08G 59/508 |
| 10,403,603 | B2 * | 9/2019 | Park | H10D 62/10 |
| 10,658,300 | B2 * | 5/2020 | Kim | H05K 1/111 |
| 10,804,209 | B2 | 10/2020 | Kang | |
| 10,886,255 | B2 | 1/2021 | Hong et al. | |
| 10,930,613 | B2 * | 2/2021 | Park | H10W 72/073 |
| 11,056,432 | B2 * | 7/2021 | Lee | H10P 54/00 |
| 11,145,625 | B2 | 10/2021 | Koyanagi | |
| 11,164,805 | B2 * | 11/2021 | Kim | H10W 40/22 |
| 11,222,873 | B2 | 1/2022 | Jun et al. | |
| 11,923,286 | B2 * | 3/2024 | Jang | H10W 70/65 |
| 12,406,895 | B2 * | 9/2025 | Jang | H10W 74/019 |
| 12,512,427 | B2 * | 12/2025 | Oh | H10W 70/60 |
| 2003/0193076 | A1 * | 10/2003 | Patti | H10W 20/023 257/E21.597 |
| 2005/0263869 | A1 * | 12/2005 | Tanaka | H10W 20/0234 257/E23.021 |
| 2007/0176275 | A1 * | 8/2007 | Singleton | H10W 72/90 257/E23.085 |
| 2009/0001602 | A1 * | 1/2009 | Chung | H10W 20/023 438/109 |
| 2009/0072375 | A1 * | 3/2009 | Song | H10W 74/012 257/686 |
| 2010/0007001 | A1 * | 1/2010 | Wang | H10W 20/20 257/E21.705 |
| 2010/0109138 | A1 * | 5/2010 | Cho | H10W 90/00 257/E25.013 |
| 2010/0182041 | A1 | 7/2010 | Feng et al. | |
| 2011/0193229 | A1 * | 8/2011 | Ma | H10W 74/012 257/738 |
| 2013/0234320 | A1 * | 9/2013 | Lu | H10W 72/0198 257/737 |
| 2013/0292842 | A1 * | 11/2013 | Kim | H10W 20/49 257/774 |
| 2013/0344658 | A1 * | 12/2013 | Sakurada | H10D 62/117 438/113 |
| 2016/0056101 | A1 * | 2/2016 | Jee | H10P 72/74 257/737 |
| 2016/0064357 | A1 * | 3/2016 | Choe | H10W 20/0249 438/109 |
| 2017/0110388 | A1 * | 4/2017 | Park | H10W 20/0234 |
| 2017/0243856 | A1 * | 8/2017 | Park | H10W 72/0198 |
| 2018/0040586 | A1 * | 2/2018 | Wei | H10W 70/611 |
| 2019/0221520 | A1 * | 7/2019 | Kim | H05K 1/111 |
| 2020/0098719 | A1 * | 3/2020 | Park | H10W 72/073 |
| 2020/0328189 | A1 | 10/2020 | Sung | |
| 2021/0159213 | A1 * | 5/2021 | Kim | H10W 90/00 |
| 2021/0193640 | A1 * | 6/2021 | Song | H10W 20/20 |
| 2021/0358875 | A1 * | 11/2021 | Lee | H10P 72/74 |
| 2022/0059455 | A1 | 2/2022 | Chen | |
| 2022/0093521 | A1 * | 3/2022 | Ma | H10P 72/74 |
| 2022/0199511 | A1 * | 6/2022 | Jang | H10W 70/65 |
| 2022/0415741 | A1 * | 12/2022 | Jang | H10W 74/019 |
| 2023/0029098 | A1 * | 1/2023 | Kim | H10W 74/012 |
| 2023/0075665 | A1 * | 3/2023 | Kwon | H10D 62/117 |
| 2023/0092410 | A1 * | 3/2023 | Kim | H10P 72/74 257/668 |
| 2023/0130983 | A1 * | 4/2023 | Lee | H10W 40/22 257/787 |
| 2023/0132272 | A1 * | 4/2023 | Oh | H10W 70/60 257/295 |
| 2023/0163088 | A1 * | 5/2023 | Lee | H10P 72/74 257/621 |
| 2023/0326893 | A1 * | 10/2023 | Cha | H10W 20/20 |
| 2024/0006382 | A1 * | 1/2024 | Jang | H10W 20/20 |
| 2024/0063186 | A1 * | 2/2024 | Lee | H10P 72/74 |
| 2024/0071951 | A1 * | 2/2024 | Chang | H10W 42/121 |
| 2024/0113077 | A1 * | 4/2024 | Lee | H10W 20/0245 |
| 2024/0120251 | A1 * | 4/2024 | Park | H10W 72/0198 |
| 2024/0162184 | A1 * | 5/2024 | Park | H10B 80/00 |
| 2024/0162193 | A1 * | 5/2024 | Kim | B23K 26/38 |
| 2024/0170449 | A1 * | 5/2024 | Lee | H10W 72/072 |
| 2024/0186277 | A1 * | 6/2024 | Park | H10W 72/072 |
| 2024/0194639 | A1 * | 6/2024 | Park | H10B 80/00 |
| 2024/0222331 | A1 * | 7/2024 | Park | H10W 72/019 |
| 2024/0258278 | A1 * | 8/2024 | Shin | H10B 80/00 |
| 2024/0297150 | A1 * | 9/2024 | Hong | H10P 72/74 |
| 2024/0304599 | A1 * | 9/2024 | Chang | H10D 62/117 |
| 2024/0421012 | A1 * | 12/2024 | Park | H10W 42/121 |
| 2025/0022812 | A1 * | 1/2025 | Ryu | H10B 80/00 |
| 2025/0029955 | A1 * | 1/2025 | Jung | H10B 80/00 |
| 2025/0062177 | A1 * | 2/2025 | Lee | H10W 74/012 |
| 2025/0079393 | A1 * | 3/2025 | Park | H10W 20/023 |
| 2025/0087607 | A1 * | 3/2025 | Lee | H10W 20/20 |
| 2025/0118714 | A1 * | 4/2025 | Ma | H10W 74/121 |
| 2025/0149526 | A1 * | 5/2025 | Jang | H10B 80/00 |
| 2025/0309197 | A1 * | 10/2025 | Noh | H10B 80/00 |
| 2025/0329674 | A1 * | 10/2025 | Ko | H10W 72/90 |
| 2025/0364347 | A1 * | 11/2025 | Jang | H10W 74/019 |

FOREIGN PATENT DOCUMENTS

| | | | | | |
|---|---|---|---|---|---|
| EP | 4632813 | A2 | * | 10/2025 | H10W 90/00 |
| KR | 100914977 | B1 | * | 9/2009 | H01L 25/105 |
| KR | 101062848 | B1 | | 9/2011 | |
| KR | 101229649 | B1 | * | 2/2013 | H10W 70/60 |
| KR | 101343343 | B1 | | 12/2013 | |
| KR | 101379115 | B1 | | 3/2014 | |
| KR | 101589843 | B1 | | 1/2016 | |
| KR | 20160025280 | A | * | 3/2016 | H10W 20/212 |
| KR | 1020200043716 | A | | 4/2020 | |
| KR | 102171286 | B1 | * | 10/2020 | H10D 62/117 |
| KR | 20210065353 | A | | 6/2021 | |
| KR | 102521881 | B1 | * | 4/2023 | H10W 72/0198 |
| KR | 102530763 | B1 | * | 5/2023 | H10W 90/00 |
| KR | 20230058257 | A | * | 5/2023 | H10W 80/00 |
| KR | 10-2024-0029369 | A | | 3/2024 | |
| KR | 102647175 | B1 | * | 3/2024 | H10W 74/131 |
| KR | 20250070493 | A | * | 5/2025 | H10W 90/00 |
| KR | 20250154204 | A | * | 10/2025 | G01R 31/2896 |

* cited by examiner

SEMICONDUCTOR PACKAGE AND METHOD OF FABRICATING THE SAME

CROSS-REFERENCE TO RELATED APPLICATIONS

This U.S. nonprovisional application claims priority under 35 U.S.C. § 119 to Korean Patent Application No. 10-2022-0128997, filed on Oct. 7, 2022, and No. 10-2022-0186228 filed on Dec. 27, 2022, in the Korean Intellectual Property Office, the disclosures of both of which are hereby incorporated by reference in their entireties.

BACKGROUND

The present inventive concepts relate to a semiconductor package, and more particularly, to a semiconductor package including a chip structure and a method of fabricating the same.

A semiconductor package is provided to implement an integrated circuit chip suitable for use in electronic products. A semiconductor package is typically configured such that a semiconductor chip is mounted on a printed circuit board and bonding wires or bumps are used to electrically connect the semiconductor chip to the printed circuit board. With the development of the electronics industry, various studies have been conducted to improve reliability and durability of semiconductor packages.

SUMMARY

Some embodiments of the present inventive concepts provide a semiconductor package whose structural stability is improved.

Some embodiments of the present inventive concepts provide a semiconductor package whose productivity is increased.

The object of the present inventive concepts is not limited to those mentioned above, and other objects which have not been mentioned above will be clearly understood to those skilled in the art from the following description.

According to some embodiments of the present inventive concepts, a semiconductor package may comprise: a base semiconductor chip; a chip structure mounted on the base semiconductor chip; a connection terminal between the base semiconductor chip and the chip structure; and a molding layer on the base semiconductor chip, the molding layer surrounding the chip structure and the connection terminal. The chip structure may include: a first semiconductor chip that includes a first frontside pad and a first backside pad; and a second semiconductor chip on the first semiconductor chip, the second semiconductor chip including a second frontside pad and a second backside pad. A lateral surface of the first semiconductor chip may be aligned with a lateral surface of the second semiconductor chip. The first semiconductor chip includes a first integrated circuit and the second semiconductor chip includes a second integrated circuit the same as the first integrated circuit. The first backside pad and the second frontside pad may partially overlap each other when viewed in plan while being in direct contact with each other. The first backside pad and the second frontside pad may include the same metal and are formed into a single unitary piece.

According to some embodiments of the present inventive concepts, a semiconductor package may comprise: a base semiconductor chip; a chip stack mounted on the base semiconductor chip, the chip stack including a plurality of chip structures; a plurality of connection terminals on bottom surfaces of the chip structures; and a molding layer on the base semiconductor chip, the molding layer surrounding the chip structures and the connection terminals. Each of the chip structures may include an even number of semiconductor chips each of which includes a circuit layer, a protection layer, a through via, and a semiconductor substrate. The semiconductor substrate may include an active surface and an inactive surface opposite to the active surface. The circuit layer may be on the active surface. The protection layer may be on the inactive surface. In each of the chip structures, the semiconductor chips may be stacked to allow the active surface and the inactive surface to face each other.

According to some embodiments of the present inventive concepts, a method of fabricating a semiconductor package may comprise: forming a chip structure that includes a first semiconductor chip and a second semiconductor chip; providing the chip structure on a base semiconductor chip; allowing the base semiconductor chip and the chip structure to undergo an annealing process to bond the base semiconductor chip and the chip structure to each other; and forming on the base semiconductor chip a molding layer that surrounds the chip structure. The step of forming the chip structure may include: forming a first substrate that includes a plurality of first semiconductor chips, the first substrate having a first active surface and a first inactive surface that are opposite to each other; forming a second substrate that includes a plurality of second semiconductor chips, the second substrate having a second active surface and a second inactive surface that are opposite to each other; bonding the first substrate and the second substrate to cause the first inactive surface of the first substrate to face the second active surface of the second substrate; and performing a sawing process to cut the first and second substrates.

DETAILED DESCRIPTION OF EMBODIMENTS

Figure 1:
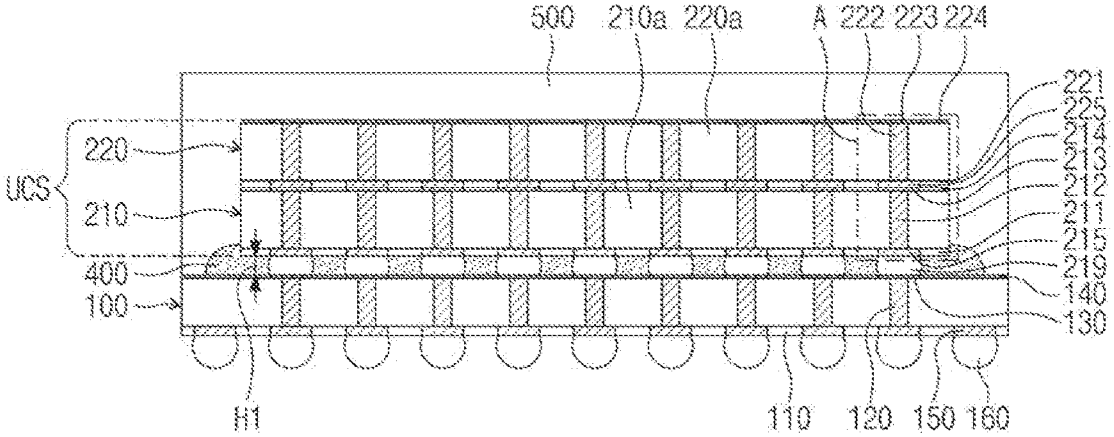
FIG. 1 illustrates a cross-sectional view showing a semiconductor package according to example embodiments of the present inventive concepts.

The following will now describe example embodiments of the present inventive concepts with reference to the accompanying drawings. Like reference numerals refer to like components throughout the description.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact", there are no intervening elements present at the point of contact.

FIG. 1 illustrates a cross-sectional view showing a semiconductor package according to example embodiments of the present inventive concepts.

Referring to FIG. 1, a semiconductor package may be provided. The semiconductor package may include a base semiconductor chip 100, a chip structure UCS, a non-conductive layer 400, and a molding layer 500. For example, the semiconductor package may be a stacked package in which a through via is used. In this configuration, the base semiconductor chip 100 may be provided thereon with the chip structure UCS in which semiconductor chips are stacked.

The base semiconductor chip 100 may be provided. The base semiconductor chip 100 may include an integrated circuit therein. For example, the base semiconductor chip 100 may include an electronic element such as a transistor. The base semiconductor chip 100 may be a wafer-level die formed of a semiconductor such as silicon (Si). The present inventive concepts, however, are not limited thereto. The base semiconductor chip 100 may be a printed circuit board (PCB) that does not include an electronic element such as a transistor.

The base semiconductor chip 100 may include a circuit layer 110, a through via 120, a backside pad 130, a protection layer 140, and a frontside pad 150.

The circuit layer 110 may be provided on a bottom surface of the base semiconductor chip 100. The circuit layer 110 may include the integrated circuit discussed above. For example, the circuit layer 110 may be a memory circuit, a logic circuit, or a combination thereof. The circuit layer 110 may include a wiring pattern, a dielectric pattern, and electronic elements such as transistors.

The through via 120 may vertically penetrate the base semiconductor chip 100. For example, the through via 120 may connect the circuit layer 110 to a top surface of the base semiconductor chip 100. The through via 120 and the circuit layer 110 may be electrically connected to each other. The through via 120 may be provided in plural. Although not shown in figures, a dielectric layer may be provided to surround the through via 120. For example, the dielectric layer may include at least one selected from silicon oxide (SiO), silicon nitride (SiN), silicon oxynitride (SiON), and low-k dielectrics.

The backside pad 130 may be disposed on the top surface of the base semiconductor chip 100. The backside pad 130 may be connected to the through via 120. For example, the backside pad 130 may contact the through via 120. The backside pad 130 may be provided in plural. In this case, because the backside pads 130 are correspondingly connected to the through vias 120, an arrangement of the backside pads 130 may conform to that of the through vias 120. The backside pad 130 may be connected through the through via 120 to the circuit layer 110. The backside pad 130 may include various metallic materials, such as copper (Cu), aluminum (Al), and/or nickel (Ni).

The base semiconductor chip 100 may be provided on its top surface with the protection layer 140 that surrounds the backside pad 130. The protection layer 140 may expose the backside pad 130. For example, a top surface of the protection layer 140 may be coplanar with that of the backside pad 130. The base semiconductor chip 100 may be protected by the protection layer 140. For example, the protection layer 140 may include silicon oxide (SiO), silicon nitride (SiN), silicon oxynitride (SiON), or silicon carbonitride (SiCN).

The frontside pad 150 may be provided on the bottom surface of the base semiconductor chip 100. For example, the frontside pad 150 may be exposed on a bottom surface of the circuit layer 110. In this case, a bottom surface of the frontside pad 150 may be coplanar with that of the circuit layer 110. The frontside pad 150 may be electrically connected to the circuit layer 110. The frontside pad 150 may be provided in plural. For example, the frontside pad 150 may include various metallic materials, such as copper (Cu), aluminum (Al), and/or nickel (Ni).

Although not shown in figures, the base semiconductor chip 100 may further include a lower protection layer. The base semiconductor chip 100 may be provided on its bottom surface with the lower protection layer that covers the circuit layer 110. The circuit layer 110 may be protected by the lower protection layer. The lower protection layer may expose the frontside pad 150. For example, the lower protection layer may include silicon oxide (SiO), silicon nitride (SiN), silicon oxynitride (SiON), or silicon carbonitride (SiCN).

An external terminal 160 may be provided on the bottom surface of the base semiconductor chip 100. The external terminal 160 may be disposed on the frontside pad 150. The external terminal 160 may be electrically connected to the circuit layer 110 and the through via 120. The external terminal 160 may be provided in plural. The external terminals 160 may be correspondingly connected to the frontside pads 150. The semiconductor package may be electrically connected through the external terminal 160 to another semiconductor package or an external electronic apparatus. For example, the external terminal 160 may be an alloy that includes at least one selected from tin (Sn), silver (Ag), copper (Cu), nickel (Ni), bismuth (Bi), indium (In), antimony (Sb), and cerium (Ce).

Alternatively, the external terminal 160 may be disposed below the through via 120. In this case, although not illustrated, the through via 120 may penetrate the circuit layer 110 to be exposed on the bottom surface of the circuit layer 110. The external terminal 160 may be directly connected to the through via 120.

The chip structure UCS may be positioned on the base semiconductor chip 100. The chip structure UCS may include a first semiconductor chip 210 and a second semiconductor chip 220. The first and second semiconductor chips 210 and 220 may be of the same type. For example, the first and second semiconductor chips 210 and 220 may be memory chips. The first and second semiconductor chips 210 and 220 may be sequentially stacked on the base semiconductor chip 100.

The first semiconductor chip 210 may be positioned on the base semiconductor chip 100, and may include a first semiconductor substrate 210*a*, a first circuit layer 211, a first through via 212, a first backside pad 213, a first protection layer 214, a first frontside pad 215, and a connection terminal 219.

The first circuit layer 211 may be provided on a bottom surface of the first semiconductor substrate 210*a*. The first circuit layer 211 may include an integrated circuit. The first circuit layer 211 may include a wiring pattern, a dielectric pattern, and an electronic element such as a transistor.

The first through via 212 may vertically penetrate the first semiconductor substrate 210*a*. The first through via 212 may connect the first frontside pad 215 and the first backside pad 213 to each other. For example, the first through via 212 may be electrically connected to the first circuit layer 211. The first through via 212 may be provided in plural. A dielectric layer (not shown) may be provided to surround the first through via 212. For example, the dielectric layer (not shown) may include at least one selected from silicon oxide (SiO), silicon nitride (SiN), silicon oxynitride (SiON), and low-k dielectrics.

The first protection layer 214 may be provided on a top surface of the first semiconductor substrate 210*a*. The first protection layer 214 may protect the first semiconductor chip 210. For example, the first protection layer 214 may include silicon oxide (SiO), silicon nitride (SiN), silicon oxynitride (SiON), or silicon carbonitride (SiCN).

The first backside pad 213 may be disposed in the first protection layer 214. The first protection layer 214 may expose a top surface of the first backside pad 213. A top surface of the first protection layer 214 may be coplanar with that of the first backside pad 213. The first backside pad 213 may be connected to the first through via 212. In example embodiments, the first backside pad 213 may contact an upper surface of the first through via 212.

The first frontside pad 215 may be disposed in the first circuit layer 211. For example, the first circuit layer 211 may expose a bottom surface of the first frontside pad 215. The bottom surface of the first frontside pad 215 may be coplanar with that of the first circuit layer 211. The first frontside pad 215 may be connected to the first circuit layer 211. The first backside pad 213 and the first frontside pad 215 may be electrically connected to each other through the first circuit layer 211 and the first through via 212. Each of the first backside pad 213 and the first frontside pad 215 may be provided in plural. In this case, each of the first backside pads 213 and the first frontside pads 215 may be connected to a corresponding first through via 212. For example, the first backside pad 213 and the first frontside pad 215 may include various metallic materials, such as copper (Cu), aluminum (Al), and/or nickel (Ni).

The connection terminal 219 may be positioned below the first frontside pad 215 of the first semiconductor chip 210. For example, the connection terminal 219 may be disposed between the first frontside pad 215 of the first semiconductor chip 210 and the backside pad 130 of the base semiconductor chip 100. In example embodiments, the connection terminal 219 may contact the first frontside pad 215 of the first semiconductor chip 210. The connection terminal 219 may be provided in plural, and may electrically connect the chip structure UCS and the base semiconductor chip 100 to each other. For example, the connection terminal 219 may be a solder ball or a solder bump formed of an alloy that includes at least one selected from tin (Sn), silver (Ag), copper (Cu), nickel (Ni), bismuth (Bi), indium (In), antimony (Sb), and cerium (Ce).

The connection terminal 219 may vertically separate the chip structure UCS and the base semiconductor chip 100 from each other. For example, the chip structure UCS may have a first distance H1 in a vertical direction from the base semiconductor chip 100. For example, the first distance H1 may range from about 10 μm to about 15 μm. Thus, even when the chip structure UCS and the base semiconductor chip 100 have therebetween a large foreign particle having a size as much as about 10 μm, the connection terminal 219 may prevent an electrical short between the chip structure UCS and the base semiconductor chip 100. Accordingly, the semiconductor package may be prevented from failure caused by foreign particles.

The second semiconductor chip 220 may be positioned on the first semiconductor chip 210, and may include a second semiconductor substrate 220*a*, a second circuit layer 221, a second protection layer 224, a second through via 222, a second frontside pad 225, and a second backside pad 223.

The second circuit layer 221 may be provided on a bottom surface of the second semiconductor substrate 220*a*. The second protection layer 224 may be provided on a top surface of the second semiconductor substrate 220*a*. The second through via 222 may vertically penetrate the second semiconductor substrate 220*a*, and may connect the second frontside pad 225 and the second backside pad 223 to each other. The second backside pad 223 may be disposed in the second protection layer 224. The second frontside pad 225 may be disposed in the second circuit layer 221.

Each of components included in the second semiconductor chip 220 may have a configuration substantially the same as that of a corresponding one of components included in the first semiconductor chip 210. For example, the first semiconductor substrate 210*a* may be configured substantially the same as the second semiconductor substrate 220*a*, the second circuit layer 221 may be configured substantially the same as the first circuit layer 211, the second through via 222 may be configured substantially the same as the first through via 212, the second backside pad 223 may be configured substantially the same as the first backside pad 213, the second protection layer 224 may be configured substantially the same as the first protection layer 214, and the second frontside pad 225 may be configured substantially the same as the first frontside pad 215. For example, the second semiconductor chip 220 and the first semiconductor chip 210 may be the same semiconductor chip.

The non-conductive layer 400 may be provided between the chip structure UCS and the base semiconductor chip 100. For example, the non-conductive layer 400 may fill a space between the first semiconductor chip 210 and the base semiconductor chip 100, and may surround the connection terminal 219. The non-conductive layer 400 may be in contact with a bottom surface of the first semiconductor chip 210 and the top surface of the base semiconductor chip 100. In addition, the non-conductive layer 400 may outwardly protrude from a lateral surface of the first semiconductor chip 210. A length in a horizontal direction of the non-conductive layer 400 may be greater than a length in the horizontal direction of the first semiconductor chip 210. Therefore, the non-conductive layer 400 may cover a portion of the lateral surface of the first semiconductor chip 210. For example, a portion of the non-conductive layer 400 may contact the lateral surface of the first semiconductor chip 210.

For example, the non-conductive layer 400 may include a non-conductive film (NCF), a non-conductive paste (NCP), a dielectric polymer, or any other suitable epoxy-based material containing no conductive particles. For example, the non-conductive layer 400 containing no conductive particles may be used to accomplish fineness of the connection terminals 219 without electrical shorts between neighboring connection terminals 219. In addition, because the non-conductive layer 400 acts as an underfill to fill a space between the chip structure UCS and the base semiconductor chip 100, the connection terminals 219 may increase in mechanical durability.

The molding layer 500 may be provided on the base semiconductor chip 100. The molding layer 500 may cover the top surface of the base semiconductor chip 100. A lateral surface of the molding layer 500 may be aligned with that of the base semiconductor chip 100. The molding layer 500 may surround the chip structure UCS. For example, the molding layer 500 may cover lateral surfaces of the first and second semiconductor chips 210 and 220 and a top surface of the second semiconductor chip 220. Alternatively, the molding layer 500 may expose the top surface of the second semiconductor chip 220. An outer lateral surface of the molding layer 500 may be spaced apart from the non-conductive layer 400. The molding layer 500 may include a dielectric material. For example, the molding layer 500 may include an epoxy molding compound (EMC).

The first semiconductor chip 210 and the second semiconductor chip 220 included in the chip structure UCS may be in direct contact with each other without separate connection terminals. For example, the non-conductive layer 400 may not be provided between the first semiconductor chip 210 and the second semiconductor chip 220. In this configuration, the semiconductor package may have a reduced volume of the non-conductive layer 400. Thus, it may be possible to prevent warpage caused by the non-conductive layer 400 having a large coefficient of thermal expansion and to suppress delamination between the first and second semiconductor chips 210 and 220. Accordingly, the semiconductor package may increase in structural stability.

An even number of the same semiconductor chips may be provided in one chip structure UCS. For example, one chip structure UCS may include two, four, six, or eight semiconductor chips. An even number of semiconductor chips may be included in a semiconductor package of the present inventive concepts. For example, the semiconductor package may be efficiently fabricated by providing an even number of semiconductor chips to constitute one chip structure UCS.

Figure 2:
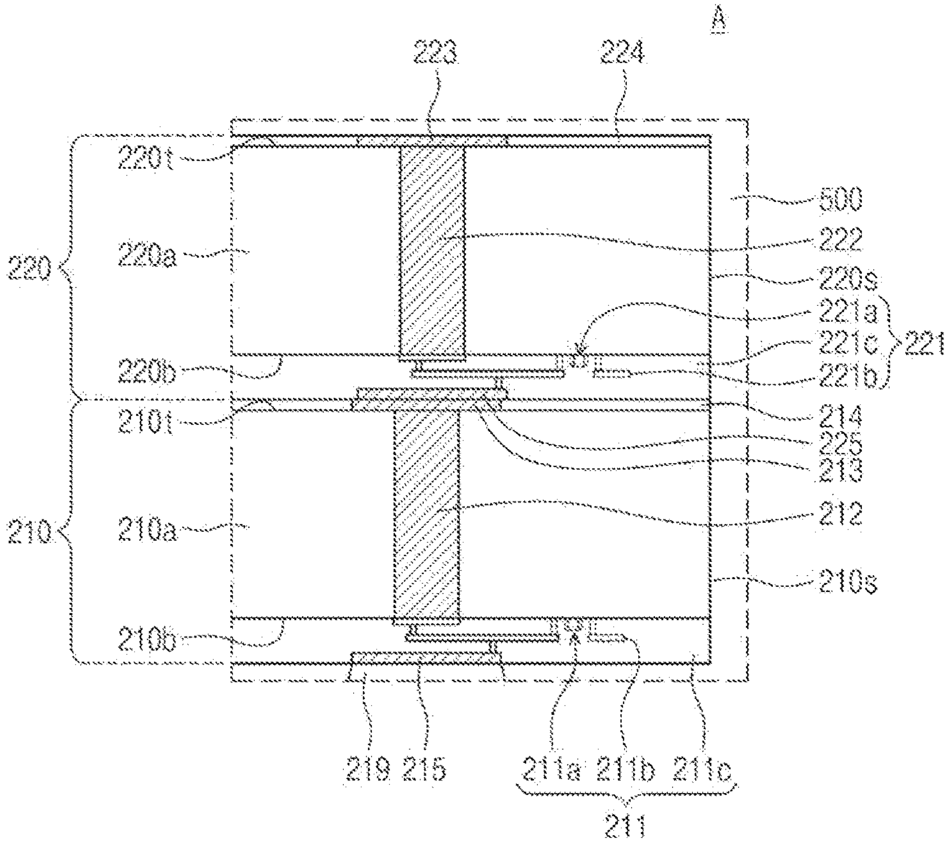
FIG. 2 illustrates an enlarged view showing section A depicted in FIG. 1.

FIG. 2 illustrates an enlarged view showing section A depicted in FIG. 1.

In the following, a description of components the same as those discussed with reference to FIG. 1 will be omitted, and a difference thereof will be discussed in detail.

Referring to FIG. 2, the first semiconductor substrate 210*a* of the first semiconductor chip 210 may include a first top surface 210*t* and a first bottom surface 210*b*. The first top surface 210*t* of the first semiconductor substrate 210*a* may be opposite to the first bottom surface 210*b* of the first semiconductor substrate 210*a*. The first circuit layer 211 may be positioned on the first bottom surface 210*b* of the first semiconductor substrate 210*a*. The first protection layer 214 may be positioned on the first top surface 210*t* of the first semiconductor substrate 210*a*. For example, the first bottom surface 210*b* of the first semiconductor substrate 210*a* may be an active surface of the first semiconductor chip 210. The first top surface 210*t* of the first semiconductor substrate 210*a* may be an inactive surface of the first semiconductor chip 210. The active surface and the inactive surface of the first semiconductor chip 210 may be opposite to each other. The active surface may be the surface on which devices are formed, and the inactive surface may be the surface which does not include any devices.

Like the first semiconductor substrate 210*a*, the second semiconductor substrate 220*a* of the second semiconductor chip 220 may include a second top surface 220*t* and a second bottom surface 220*b* that are opposite to each other. For example, the second bottom surface 220*b* of the second semiconductor substrate 220*a* may be an active surface of the second semiconductor chip 220. The second top surface 220*t* of the second semiconductor substrate 220*a* may be an inactive surface of the second semiconductor chip 220. The active surface and the inactive surface of the second semiconductor chip 220 may be opposite to each other.

In example embodiments, a top surface of the first through via 212 may be coplanar with the first top surface 210*t* of the first semiconductor substrate 210*a*, and a bottom surface of the first through via 212 may be coplanar with the first bottom surface 210*b* of the first semiconductor substrate 210*a*. Likewise, a top surface of the second through via 222 may be coplanar with second top surface 220*t* of the second semiconductor substrate 220*a*, and a bottom surface of the second through via 222 may be coplanar with the second bottom surface 220*b* of the second semiconductor substrate 220*a*.

In this description below, an interface between a semiconductor substrate and a circuit layer of each of semiconductor chips may correspond to an active surface of the related semiconductor chip. In addition, an interface between a semiconductor substrate and a protection layer of each of semiconductor chips may correspond to an inactive surface of the related semiconductor chip.

The first circuit layer 211 of the first semiconductor chip 210 may include a first integrated circuit 211*a*, a first wiring pattern 211*b*, and a first dielectric pattern 211*c*. The first integrated circuit 211*a* may be positioned on the active surface of the first semiconductor chip 210. For example, the first integrated circuit 211*a* may include a memory circuit. The first integrated circuit 211*a* may be connected through the first wiring pattern 211*b* to the first through via 212 and the first frontside pad 215. The first dielectric pattern 211*c* may be positioned on the active surface of the first semiconductor chip 210 to cover the first integrated circuit 211*a* and the first wiring pattern 211*b*.

The second circuit layer 221 of the second semiconductor chip 220 may include a second integrated circuit 221*a*, a second wiring pattern 221*b*, and a second dielectric pattern 221*c*. The second integrated circuit 221*a* may be positioned on the active surface of the second semiconductor chip 220. For example, the second integrated circuit 221*a* may include a memory circuit. The second integrated circuit 221*a* may be connected through the second wiring pattern 221*b* to the second through via 222 and the second frontside pad 225. The second dielectric pattern 221*c* may be positioned on the active surface of the second semiconductor chip 220 to cover the second integrated circuit 221*a* and the second wiring pattern 221*b*.

As the second semiconductor chip 220 and the first semiconductor chip 210 are the same type of semiconductor chip, the second integrated circuit 221*a* and the first integrated circuit 211*a* may include the type of same memory circuit. In example embodiments, the second integrated circuit 221*a* and the first integrated circuit 211*a* may be identical. In addition, the second wiring pattern 221*b* may have the same shape as that of the first wiring pattern 211*b*.

The second semiconductor chip 220 may be positioned on and in contact with the first semiconductor chip 210. The first protection layer 214 of the first semiconductor chip 210 may be in direct contact with the second circuit layer 221 of the second semiconductor chip 220. For example, the inactive surface of the first semiconductor chip 210 may face the active surface of the second semiconductor chip 220. In this sense, the first and second semiconductor chips 210 and 220 may be bonded in a face-to-back fashion.

The first backside pad 213 of the first semiconductor chip 210 may be in direct contact with the second frontside pad 225 of the second semiconductor chip 220. In this configuration, the first backside pad 213 and the second frontside pad 225 may constitute an intermetallic hybrid bonding. In this description, the term "hybrid bonding" may denote a bonding in which two components of the same kind are merged at an interface therebetween. For example, the first backside pad 213 and the second frontside pad 225 that are bonded to each other may have a continuous configuration, and an invisible interface may be provided between the first backside pad 213 and the second frontside pad 225. The first backside pad 213 and the second frontside pad 225 may be formed of the same material, and thus no interface may be present between the first backside pad 213 and the second frontside pad 225. For example, the first backside pad 213 and the second frontside pad 225 may be provided in the form of one component. The first backside pad 213 and the second frontside pad 225 may be connected to form a single unitary piece.

A lateral surface of the first backside pad 213 may not be aligned with that of the second frontside pad 225. For example, the first backside pad 213 and the second frontside pad 225 may be in direct contact with each other, and may not be vertically aligned with each other. When viewed in plan, the first backside pad 213 may vertically overlap only a portion of the second frontside pad 225. In this configuration, a portion of the first backside pad 213 may be in contact with the second dielectric pattern 221*c* of the second circuit layer 221, and the second frontside pad 225 may be in contact with a portion of the first protection layer 214.

Alternatively, the lateral surface of the first backside pad 213 may be aligned with that of the second frontside pad 225. When viewed in plan, the first backside pad 213 and the second frontside pad 225 may completely overlap each other.

The first protection layer 214 of the first semiconductor chip 210 may be in contact with the second dielectric pattern 221*c* of the second circuit layer 221 included in the second semiconductor chip 220. In this case, the first protection layer 214 and the second dielectric pattern 221*c* may constitute a hybrid bonding of oxide, nitride, or oxynitride. The first protection layer 214 and the second dielectric pattern 221*c* that are bonded to each other may have a continuous configuration, and an invisible interface may be provided between the first protection layer 214 and the second dielectric pattern 221*c*. The first protection layer 214 and the second dielectric pattern 221*c* may be formed of the same material, such as silicon oxide (SiO), silicon nitride (SiN), silicon oxynitride (SiON), or silicon carbonitride (SiCN), and no interface may be present between the first protection layer 214 and the second dielectric pattern 221*c*. The first protection layer 214 and the second dielectric pattern 221*c* may be connected to form a single unitary piece.

In some embodiments, the first protection layer 214 and the second dielectric pattern 221*c* may be formed of different materials. In this case, the first protection layer 214 and the second dielectric pattern 221*c* may not have a continuous configuration, and a visible interface may be provided between the first protection layer 214 and the second dielectric pattern 221*c*.

A lateral surface 210*s* of the first semiconductor chip 210 may be aligned with a lateral surface 220*s* of the second semiconductor chip 220. For example, the first and second semiconductor substrates 210*a* and 220*a*, the first and second circuit layers 211 and 221, and the first and second protection layers 214 and 224 may have their lateral surfaces all of which are aligned with each other.

Figure 3:
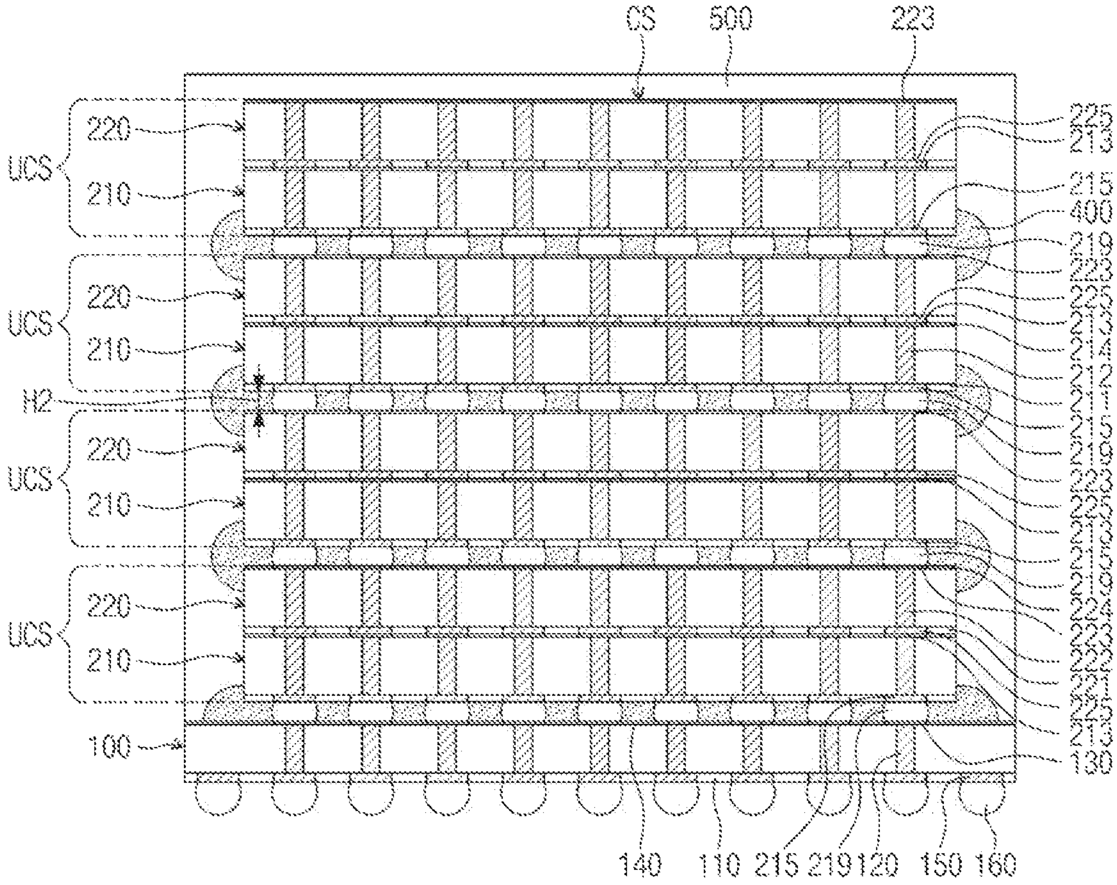
FIG. 3 illustrates a cross-sectional view showing a semiconductor package according to example embodiments of the present inventive concepts.

FIG. 3 illustrates a cross-sectional view showing a semiconductor package according to example embodiments of the present inventive concepts.

In the following, a description of components the same as those discussed with reference to FIGS. 1 and 2 will be omitted, and a difference thereof will be discussed in detail.

Referring to FIG. 3, a chip stack CS may be provided on a base semiconductor chip 100. The chip stack CS may include a plurality of chip structures UCS. Each of the plurality of chip structures UCS may be substantially the same as the chip structure UCS discussed in FIGS. 1 and 2.

The chip structure UCS may include a first semiconductor chip 210 and a second semiconductor chip 220. The first and second semiconductor chips 210 and 220 may be in direct contact with each other. An inactive surface of the first semiconductor chip 210 may face an active surface of the second semiconductor chip 220. In this sense, the first semiconductor chip 210 and the second semiconductor chip 220 may be bonded in a face-to-back fashion.

In addition, a first backside pad 213 of the first semiconductor chip 210 and a second frontside pad 225 of the second semiconductor chip 220 may include the same metallic material and may be formed into a single unitary piece. In this configuration, the first backside pad 213 and the second frontside pad 225 may constitute a hybrid bonding.

Connection terminals 219 may be provided between each of the plurality of chip structures UCS. For example, the connection terminal 219 may be positioned between a first frontside pad 215 of the first semiconductor chip 210 and a second backside pad 223 of the second semiconductor chip 220.

Thus, the plurality of chip structures UCS may be spaced apart from each other in a vertical direction. A second distance H2 may be given as a distance in a vertical direction between each of the plurality of chip structures UCS. For example, the second distance H2 may range from about 10 μm to about 15 μm. The second distance H2 may be substantially the same as the first distance H1 of FIG. 1. Thus, even when the chip structures UCS have therebetween a large foreign particle having a size as much as about 10 μm, the connection terminal 219 may prevent an electrical short between the chip structures UCS. Accordingly, the semiconductor package may be prevented from failure caused by foreign particles.

A non-conductive layer 400 may be provided between each of the plurality of chip structures UCS, and may surround the connection terminals 219. For example, the non-conductive layers 400 may cover a bottom surface of the first semiconductor chip 210 and a top surface of the second semiconductor chip 220. The non-conductive layers 400 may partially cover a lateral surface of the first semiconductor chip 210 and a lateral surface of the second semiconductor chip 220. For example, the non-conductive layers 400 may contact lateral surfaces of the first semiconductor chip 210 and the second semiconductor chip 220. A reduction in level of the non-conductive layers 400 may cause an increase in load that downwardly applies to the non-conductive layers 400, which may result in an increase in length in a horizontal direction of the non-conductive layers 400. For example, a horizontal length of a lowermost non-conductive layer 400 may be greater than a horizontal length of an uppermost non-conductive layer 400. For example, a horizontal length of a non-conductive layer 400 between the base semiconductor chip 100 and the lowermost chip structure UCS may be greater than a horizontal length of an uppermost non-conductive layer 400.

The base semiconductor chip 100 may be provided thereon with a molding layer 500 that surrounds the chip stack CS. For example, on the base semiconductor chip 100, the molding layer 500 may surround the plurality of chip structures UCS and the non-conductive layers 400. A lateral surface of the molding layer 500 may be aligned with that of the base semiconductor chip 100.

Figure 4:
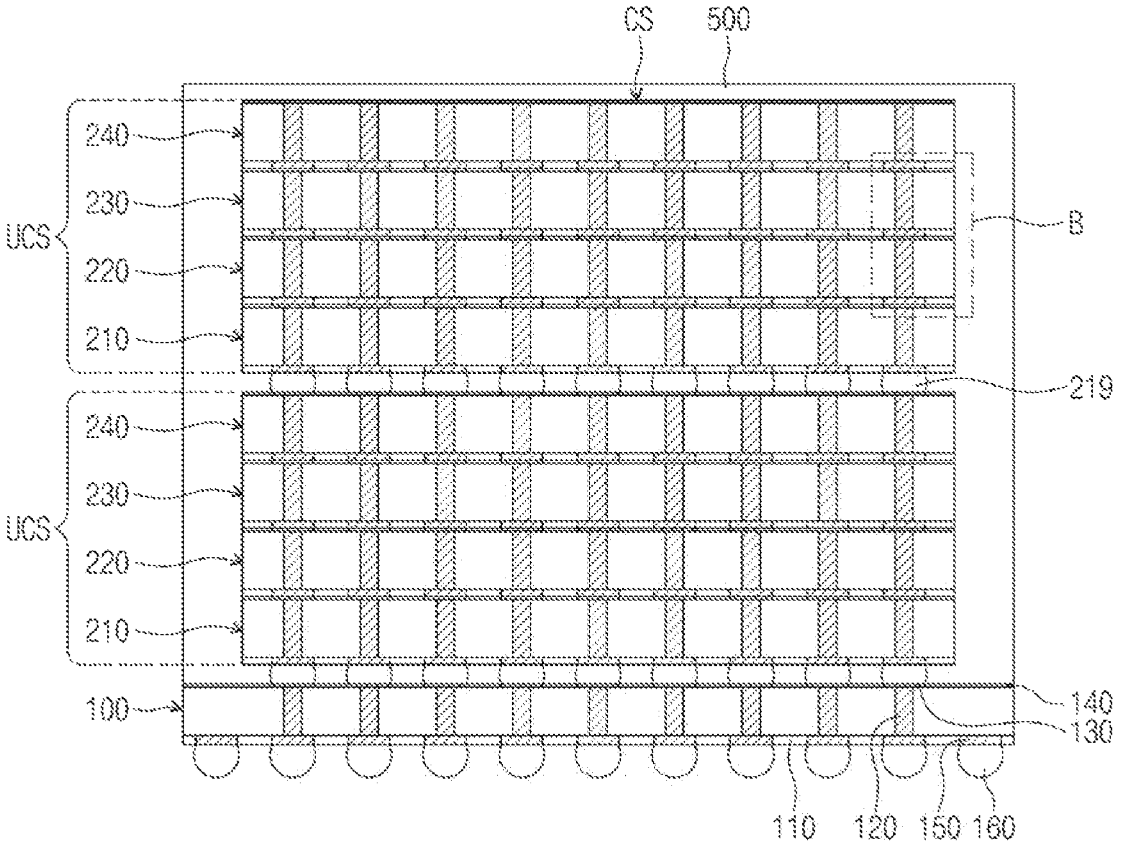
FIG. 4 illustrates a cross-sectional view showing a semiconductor package according to example embodiments of the present inventive concepts.
Figure 5:
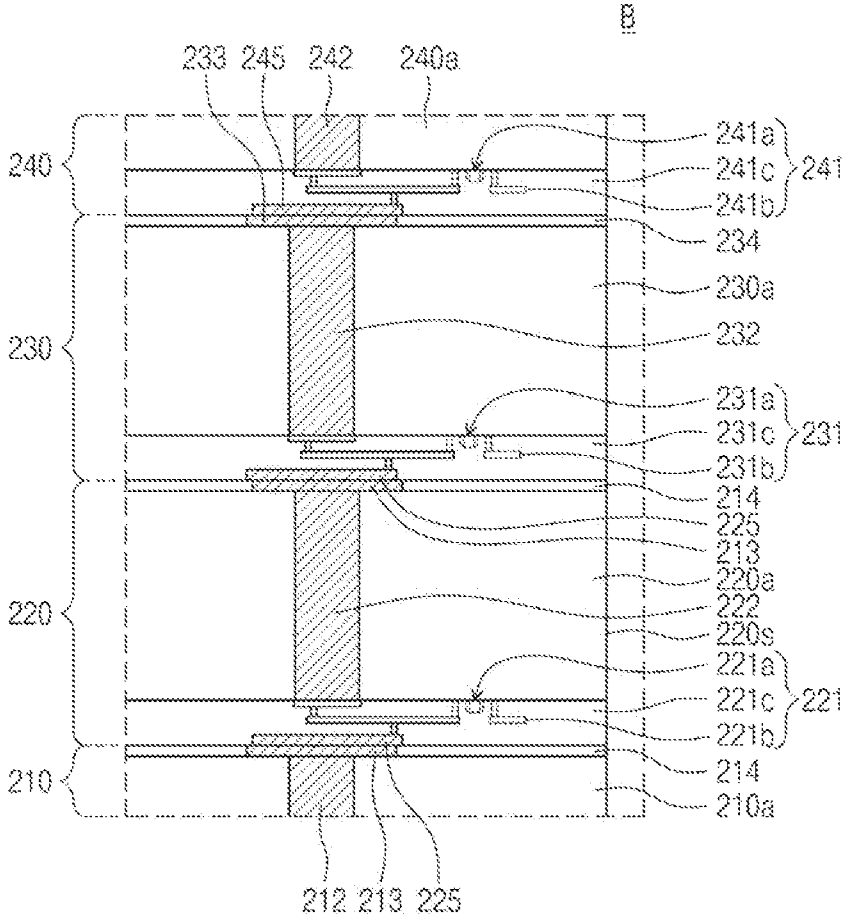
FIG. 5 illustrates an enlarged view showing section B depicted in FIG. 4.

FIG. 4 illustrates a cross-sectional view showing a semiconductor package according to example embodiments of the present inventive concepts. FIG. 5 illustrates an enlarged view showing section B depicted in FIG. 4.

In the following, a description of components the same as those discussed with reference to FIG. 1 will be omitted, and a difference thereof will be discussed in detail.

Referring to FIGS. 4 and 5, a chip stack CS may be provided on a base semiconductor chip 100. The chip stack CS may include a plurality of chip structures UCS. Each of the chip structures UCS may include first, second, third, and fourth semiconductor chips 210, 220, 230, and 240. The first, second, third, and fourth semiconductor chips 210, 220, 230, and 240 may respectively include first, second, third, and fourth semiconductor substrates 210*a*, 220*a*, 230*a*, and 240*a*, first, second, third, and fourth circuit layers 211, 221, 231, and 241, and first, second, third, and fourth protection layers 214, 224, 234, and 244. The second, third, and fourth semiconductor substrates 220*a*, 230*a*, and 240*a* may be the same as the first semiconductor substrate 210*a*, the second, third, and fourth circuit layers 221, 231, and 241 may be the same as the first circuit layer 211, and the second, third, and fourth protection layers 224, 234, and 244 may be the same as the first protection layer 214.

In one chip structure UCS, the first, second, third, and fourth semiconductor chips 210, 220, 230, and 240 may be sequentially stacked while being in direct contact with each other. The first protection layer 214 of the first semiconductor chip 210 may be in contact with the second circuit layer 221 of the second semiconductor chip 220. The second protection layer 224 of the second semiconductor chip 220 may be in contact with the third circuit layer 231 of the third semiconductor chip 230. The third protection layer 234 of the third semiconductor chip 230 may be in contact with the fourth circuit layer 241 of the fourth semiconductor chip 240. For example, an inactive surface of the first semiconductor chip 210 may face an active surface of the second semiconductor chip 220. An inactive surface of the second semiconductor chip 220 may face an active surface of the third semiconductor chip 230. An inactive surface of the third semiconductor chip 230 may face an active surface of the fourth semiconductor chip 240. In this sense, the first, second, third, and fourth semiconductor chips 210, 220, 230, and 240 may be bonded in a face-to-back fashion.

In detail, a first backside pad 213 and a second frontside pad 225 may be in direct contact with each other. The first backside pad 213 and the second frontside pad 225 may include the same metallic material and may be formed into a single unitary piece. The first backside pad 213 and the second frontside pad 225 may thus constitute a hybrid bonding. A second backside pad 223 and a third frontside pad 235 may be substantially the same as the first backside pad 213 and the second frontside pad 225, respectively, and a third backside pad 233 and a fourth frontside pad 245 may be substantially the same as the first backside pad 213 and the second frontside pad 225, respectively. The second backside pad 223 and the third frontside pad 235 may constitute a hybrid bonding. The third backside pad 233 and the fourth frontside pad 245 may constitute a hybrid bonding.

When viewed in plan, backside and frontside pads in contact with each other may only partially overlap each other. The backside and frontside pads in contact with each other may have their lateral surfaces that are not aligned with each other. For example, the first backside pad 213 and the second frontside pad 225 may have their lateral surfaces that are not aligned with each other, the second backside pad 223 and the third frontside pad 235 may have their lateral surfaces that are not aligned with each other, and the third backside pad 233 and the fourth frontside pad 245 may have their lateral surfaces that are not aligned with each other.

Unlike the backside and frontside pads in contact with each other, first, second, third, and fourth semiconductor chips 210, 220, 230, and 240 may have their lateral surfaces that are aligned with each other. For example, there may be alignment between lateral surfaces of the first, second, third, and fourth circuit layers 211, 221, 231, and 241, between lateral surfaces of the first, second, third, and fourth semiconductor substrates 210*a*, 220*a*, 230*a*, and 240*a*, and between lateral surfaces of the first, second, third, and fourth protection layers 214, 224, 234, and 244.

The first, second, third, and fourth semiconductor chips 210, 220, 230, and 240 may be the same kind of semiconductor chip. For example, the first, second, third, and fourth semiconductor chips 210, 220, 230, and 240 may be semiconductor memory chips. The first, second, third, and fourth circuit layers 211, 221, 231, and 241 may include their respective first, second, third, and fourth integrated circuits 211*a*, 221*a*, 231*a*, and 241*a* that are the same memory circuit.

The non-conductive layer 400 of FIG. 3 may not be provided between the chip structures UCS. A molding layer 500 may surround connection terminals 219 while being in contact with bottom and top surfaces of the chip structure UCS. Thus, it may be possible to prevent warpage caused by the non-conductive layer 400 a large coefficient of thermal expansion. No delamination may occur between the first, second, third, and fourth semiconductor chips 210, 220, 230, and 240 of the chip structure UCS. Accordingly, the semiconductor package may increase in structural stability.

Figure 6:
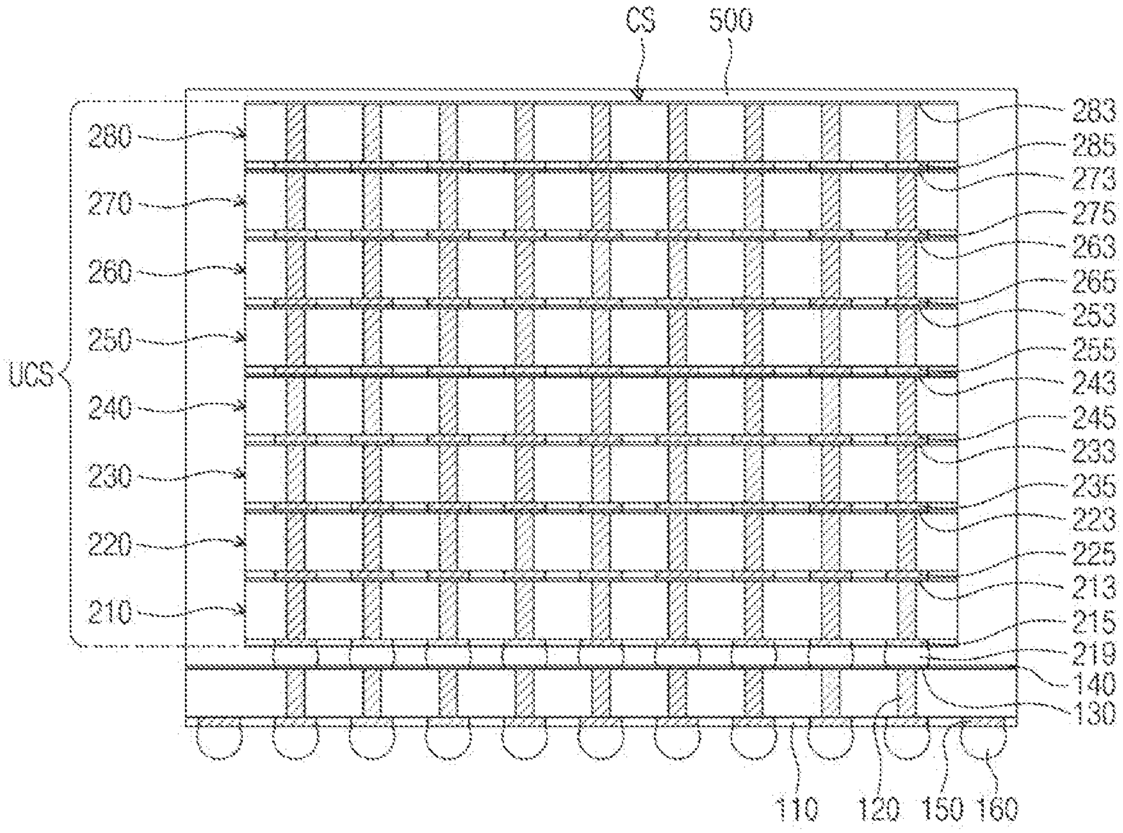
FIG. 6 illustrates a cross-sectional view showing a semiconductor package according to example embodiments of the present inventive concepts.

FIG. 6 illustrates a cross-sectional view showing a semiconductor package according to example embodiments of the present inventive concepts.

In the following, a description of components the same as those discussed with reference to FIGS. 1 to 5 will be omitted, and a difference thereof will be discussed in detail.

Referring to FIG. 6, a chip stack CS may be provided on a base semiconductor chip 100. The chip stack CS may include a single chip structure UCS. The chip stack CS may be substantially the same as the chip structure UCS. The chip structure UCS may include first, second, third, fourth, fifth, sixth, seventh, and eighth semiconductor chips 210, 220, 230, 240, 250, 260, 270, and 280. The first to eighth semiconductor chips 210 to 280 may be the same semiconductor memory chip.

The first to eighth semiconductor chips 210 to 280 may be sequentially stacked while being in direct contact with each other on the base semiconductor chip 100. The contact between the first to eighth semiconductor chips 210 to 280 may be substantially the same as that discussed in FIGS. 1 to 5. For example, the first to eighth semiconductor chips 210 to 280 may be bonded in a face-to-back fashion. An active surface of one semiconductor chip and an inactive surface of another semiconductor chip may face each other between neighboring semiconductor chips.

In addition, a hybrid bonding may be constituted by each of frontside pads 215, 225, 235, 245, 255, 265, 275, and 285 and a contacted one of backside pads 213, 223, 233, 243, 253, 263, 273, and 283. When viewed in plan, there may be a partial overlap between one of the frontside pads 215, 225, 235, 245, 255, 265, 275, and 285 and a bonded one of the backside pads 213, 223, 233, 243, 253, 263, 273, and 283. Each of the frontside pads 215, 225, 235, 245, 255, 265, 275, and 285 may be substantially the same as the first frontside pads 215, and each of the backside pads 213, 223, 233, 243, 253, 263, 273, and 283 may be substantially the same as the first backside pads 213. The first to eighth semiconductor chips 210 to 280 may have their lateral surfaces that are aligned with each other.

The chip structure UCS may include a plurality of semiconductor chips. An even number of the same semiconductor chips may be provided in one chip structure UCS. For example, one chip structure UCS may include two, four, six, or eight semiconductor chips. An even number of semiconductor chips may be included in a semiconductor package of the present inventive concepts. For example, the semiconductor package may be efficiently fabricated by providing an even number of semiconductor chips to constitute one chip structure UCS.

Figure 7:
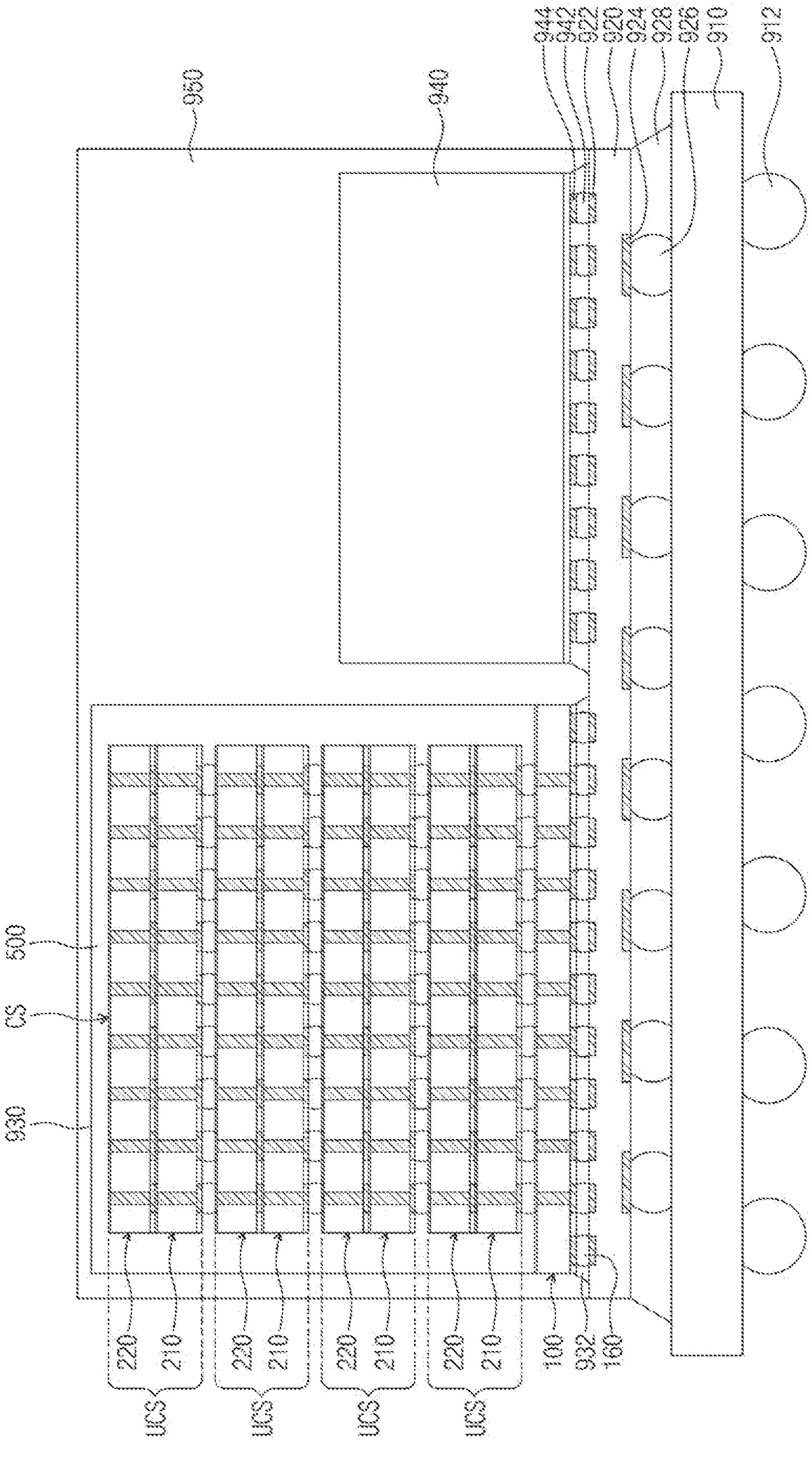
FIG. 7 illustrates a cross-sectional view showing a semiconductor module or a semiconductor package according to example embodiments of the present inventive concepts.

FIG. 7 illustrates a cross-sectional view showing a semiconductor module or a semiconductor package according to example embodiments of the present inventive concepts.

Referring to FIG. 7, a semiconductor module or a semiconductor package may be, for example, a memory module including a module substrate 910, a chip stack package 930 and a graphic processing unit (GPU) 940 that are mounted on the module substrate 910, and an outer molding layer 950 that covers the chip stack package 930 and the graphic processing unit 940. The semiconductor module may further include an interposer 920 provided on the module substrate 910.

The module substrate 910 may be provided. The module substrate 910 may include a printed circuit board (PCB).

The module substrate 910 may be provided with module terminals 912 thereunder. The module terminals 912 may include solder balls or solder bumps, and based on type of the module terminals 912, the semiconductor module or the semiconductor package may be provided in the form of one of a ball grid array (BGA) type, a fine ball grid array (FBGA) type, and a land grid array (LGA) type.

The interposer 920 may be provided on the module substrate 910. The interposer 920 may include first substrate pads 922 exposed on a top surface of the interposer 920 and second substrate pads 924 exposed on a bottom surface of the interposer 920. The interposer 920 may redistribute the input/output access to/from the chip stack package 930 and the graphic processing unit 940.

The interposer 920 may be flip-chip mounted on the module substrate 910. For example, the interposer 920 may be mounted on the module substrate 910 through substrate terminals 926 provided on the second substrate pads 924. The substrate terminals 926 may include solder balls or solder bumps. A first underfill layer 928 may be provided between the module substrate 910 and the interposer 920.

The chip stack package 930 may be disposed on the interposer 920. The chip stack package 930 may have a structure substantially the same as that of the chip stack packages discussed in FIGS. 1 to 5.

The chip stack package 930 may be mounted on the interposer 920. For example, the chip stack package 930 may be connected through external terminals 160 of the base semiconductor chip 100 to the first substrate pads 922 of the interposer 920. A second underfill layer 932 may be provided between the chip stack package 930 and the interposer 920. The second underfill layer 932 may surround the external terminals 160 of the base semiconductor chip 100, while filling a space between the interposer 920 and the base semiconductor chip 100.

The graphic processing unit 940 may be disposed on the interposer 920. The graphic processing unit 940 may be disposed spaced apart in a horizontal direction from the chip stack package 930. The graphic processing unit 940 may include a logic circuit. For example, the graphic processing unit 940 may be a logic chip. The graphic processing unit 940 may be provided with bumps 942 on a bottom surface thereof. For example, the graphic processing unit 940 may be connected through the bumps 942 to the first substrate pads 922 of the interposer 920. A third underfill layer 944 may be provided between the interposer 920 and the graphic processing unit 940. The third underfill layer 944 may surround the bumps 942, while filling a space between the interposer 920 and the graphic processing unit 940.

The outer molding layer 950 may be provided on the interposer 920. The outer molding layer 950 may cover the top surface of the interposer 920. The outer molding layer 950 may encapsulate the chip stack package 930 and the graphic processing unit 940. The outer molding layer 950 may include a dielectric material. For example, the outer molding layer 950 may include an epoxy molding compound (EMC).

Figure 8:
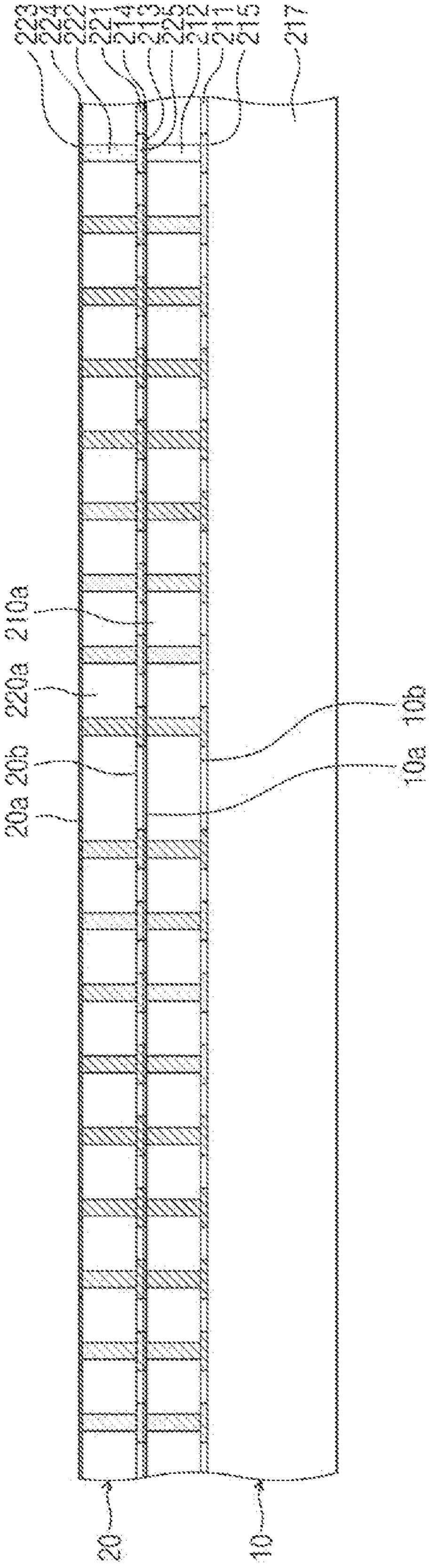
FIGS. 8, 9, and 11 illustrate cross-sectional views showing a method of fabricating a semiconductor package according to example embodiments of the present inventive concepts.
Figure 9:
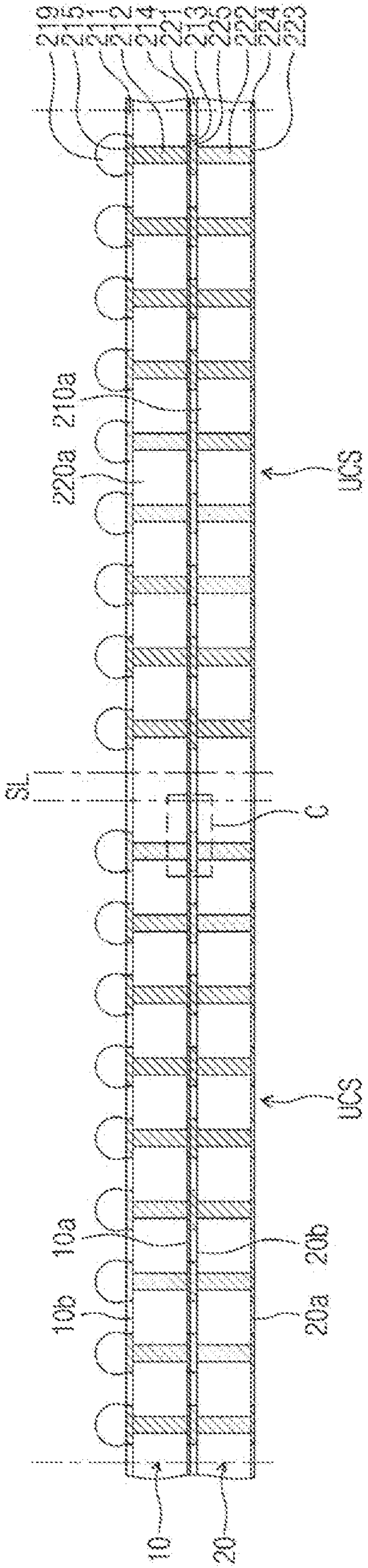
Figure 10:
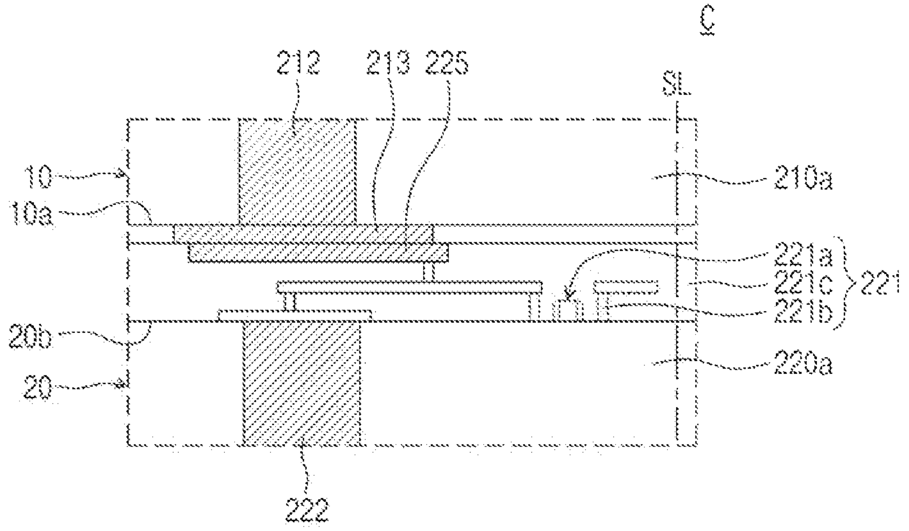
FIG. 10 illustrates an enlarged view showing section C of FIG. 8.
Figure 11:
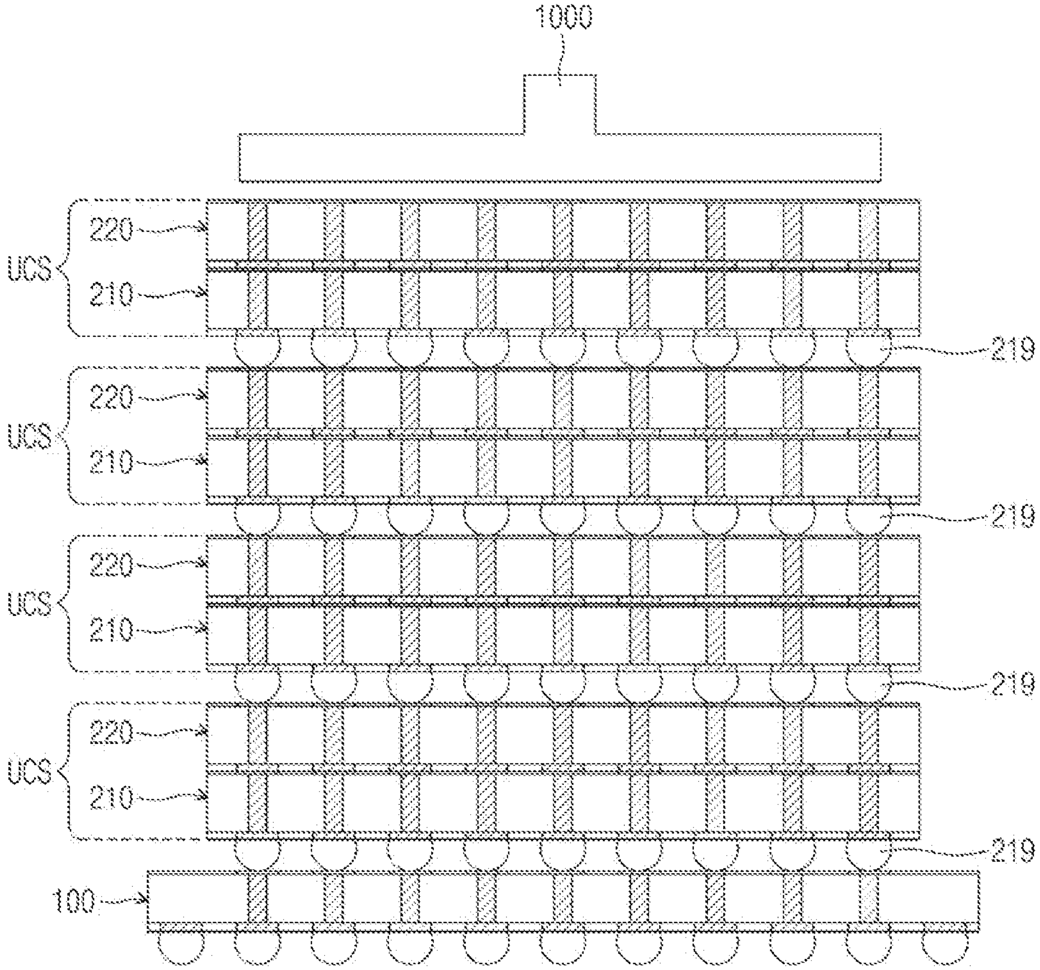

FIGS. 8, 9, and 11 illustrate cross-sectional views showing a method of fabricating a semiconductor package according to example embodiments of the present inventive concepts. FIG. 10 illustrates an enlarged view showing section C of FIG. 9.

Referring to FIG. 8, a first substrate 10 may be formed. The formation of the first substrate 10 may include forming a plurality of first semiconductor chips 210 (depicted in FIG. 1) on a base substrate 217 of the first substrate 10. The formation of the first substrate 10 may be performed by a semiconductor process. For example, the semiconductor process may include an exposure process, an etching process, a deposition process, an ion implantation process, and a cleaning process. The first substrate 10 may include a first circuit layer 211, a first semiconductor substrate 210*a*, a first through via 212, and a first protection layer 214. In addition, the first substrate 10 may include a first active surface 10*b* and a first inactive surface 10*a*. The first active surface 10*b* and the first inactive surface 10*a* may be opposite to each other. The first active surface 10*b* may be an interface between the first circuit layer 211 and the first semiconductor substrate 210*a*, and may be provided thereon with an integrated circuit of the first semiconductor chip 210. The first inactive surface 10*a* may be an interface between the first protection layer 214 and the first semiconductor substrate 210*a*. For example, the first substrate 10 may be in a state before the plurality of first semiconductor chips 210 are separated from each other.

A second substrate 20 may be formed. The formation of the second substrate 20 may be substantially the same as the formation of the first substrate 10. For example, a plurality of second semiconductor chips 220 (depicted in FIG. 1) may be formed on a base substrate (not shown) of the second substrate 20. The second substrate 20 may include a second circuit layer 221, a second semiconductor substrate 220*a*, a second through via 222, and a second protection layer 224. In addition, the second substrate 20 may include a second active surface 20*b* and a second inactive surface 20*a* that are opposite to each other. The second active surface 20*b* may be an interface between the second circuit layer 221 and the second semiconductor substrate 220*a*, and may be provided thereon with an integrated circuit of the second semiconductor chip 220. The second inactive surface 20*a* may be an interface between the second protection layer 224 and the second semiconductor substrate 220*a*. Afterwards, the base substrate of the second substrate 20 may be removed by a polishing process.

After that, the second substrate 20 may be placed on and in direct contact with the first substrate 10. For example, a top surface of the first substrate 10 may be located on the same plane on which a bottom surface of the second substrate 20 is placed. The first protection layer 214 of the first substrate 10 may be in direct contact with the second circuit layer 221 of the second substrate 20.

An annealing process may be performed on the first substrate 10 and the second substrate 20. The annealing process may bond first backside pads 213 and second frontside pads 225 to each other. For example, each of the first backside pads 213 may be bonded to a corresponding one of the second frontside pads 225 to form a single unitary piece. The bonding of the first backside pads 213 and the second frontside pads 225 may be automatically performed. For example, the first backside pads 213 and the second frontside pads 225 may be formed of the same metallic material, such as copper (Cu). The first backside pads 213 and the second frontside pads 225 may be bonded due to an intermetallic hybrid bonding caused by surface activation at an interface between the first backside pads 213 and the second frontside pads 225 that are in contact with each other.

In addition, the annealing process may bond the first protection layer 214 and the second circuit layer 221 to each other. For example, the bonding of first protection layer 214 and the second circuit layer 221 may be a hybrid bonding of oxide, nitride, oxynitride, or carbonitride.

As a result, the second substrate 20 may be directly bonded onto the first substrate 10. The first inactive surface 10*a* of the first substrate 10 may face the second active surface 20*b* of the second substrate 20. For example, the first substrate 10 and the second substrate 20 may be bonded in both wafer-to-wafer and face-to-back fashions.

Referring to FIG. 9, a polishing process may be performed on a bottom surface of the first substrate 10. The bottom surface of the first substrate 10 may be polished in a state where the first and second substrates 10 and 20 are turned upside down. The bottom surface of the first substrate 10 may be located at a highest level. The polishing process may remove the base substrate 217 of the first substrate 10. Thus, the first substrate 10 may have a reduced thickness. The thickness of the first substrate 10 may be the same as that of the second substrate 20. First frontside pads 215 of the first substrate 10 may be outwardly exposed.

Connection terminals 219 may be attached to the bottom surface of the first substrate 10. For example, the connection terminals 219 may be formed on the first frontside pads 215 exposed by the polishing process.

Referring to FIGS. 9 and 10, the formation of the connection terminal 219 may be followed by a sawing process. The sawing process may be executed along a sawing line SL of the first and second substrates 10 and 20. The sawing process may cut the first and second substrates 10 and 20. The sawing process may form the chip structures UCS of FIG. 1. The sawing process may use, for example, one of blades, lasers, or plasma.

The first and second substrates 10 and 20 may be bonded in a wafer-to-wafer fashion, and then may be cut by one sawing process. The first and second substrates 10 and 20 may have the same cutting surface, but the first backside pad 213 and the second frontside pad 215 may not be aligned with each other. The cutting surface of the first and second substrates 10 and 20 may be a lateral surface of the chip structures UCS. The chip structures UCS may have their lateral surfaces that are aligned with each other, but the first backside pad 213 and the second frontside pad 215 may have their lateral surfaces that are not aligned with each other. When viewed in plan, the first backside pad 213 and the second frontside pad 225 may partially overlap each other.

According to a method of fabricating a semiconductor package in accordance with the present inventive concepts, because the first and second substrates 10 and 20 are bonded in neither face-to-face nor back-to-back fashions, the first and second substrates 10 and 20 may not have a mirror-symmetric structure but have the same structure. For example, the first circuit layer 211, the first semiconductor substrate 210*a*, the first through via 212, and the first protection layer 214 of the first substrate 10 may be respectively the same as the second circuit layer 221, the second semiconductor substrate 220*a*, the second through via 222, and the second protection layer 224 of the second substrate 20. An integrated circuit, a wiring pattern, and a dielectric pattern of the first circuit layer 211 may be respectively the same as an integrated circuit, a wiring pattern, and a dielectric pattern of the second circuit layer 221. For example, the first substrate 10 and the second substrate 20 may be substrates formed by the same semiconductor process. Thus, it may be possible to simplify a fabrication method for forming the first and second substrates 10 and 20.

In addition, the first and second substrates 10 and 20 may be bonded in a wafer-to-wafer fashion and then a sawing process may be performed to simultaneously form the same chip structures UCS. A semiconductor package of the present inventive concepts may include the same chip structures UCS, and therefore a method of fabricating the semiconductor package may be simplified.

Referring to FIG. 11, the chip structures UCS may be positioned on a base semiconductor chip 100. For example, four chip structures UCS may be disposed in a vertical direction on the base semiconductor chip 100. The chip structure UCS may include connection terminals 219 in contact with a top surface of an underlying chip structure UCS. The connection terminals 219 of a lowermost chip structure UCS may be in contact with a top surface of the base semiconductor chip 100.

A bonding tool 1000 may be used to perform a thermocompression bonding process on the base semiconductor chip 100 and the chip structures UCS. The thermocompression bonding process may reflow the connection terminals 219. The chip structures UCS may be combined to form a chip stack CS. The chip stack CS may be mounted on the base semiconductor chip 100. For example, the formation of the chip stack CS may be performed simultaneously with the mounting of the chip stack CS on the base semiconductor chip 100.

Although not illustrated in FIG. 11, a non-conductive layer 400 may be provided between the chip stack CS and the base semiconductor chip 100 and between each of the chip structures UCS of the chip stack CS. The thermocompression bonding process may cause the non-conductive layer 400 to protrude outwardly beyond lateral surfaces of the first and second semiconductor chips 210 and 220.

Referring back to FIG. 3, a molding layer 500 may be formed on the base semiconductor chip 100. The formation of the molding layer 500 may include coating a dielectric member on the chip stack CS, and curing the dielectric member. The molding layer 500 may cover the chip stack CS. For example, on the base semiconductor chip 100, the molding layer 500 may surround the chip stack CS. After the molding layer 500 is formed, the molding layer 500 may undergo a planarization process to expose the chip structure UCS, if necessary.

In a semiconductor package according to some embodiments of the present inventive concepts, semiconductor chips included in a chip structure may be directly bonded to reduce a volume of a non-conductive layer. Thus, it may be possible to prevent failure caused by the non-conductive layer having a large coefficient of thermal expansion and to provide the semiconductor package with increased structural stability. There may be less occurrence of warpage in the chip structure, and thus no delamination may occur between the semiconductor chips that are hybrid-bonded to each other.

In a method of fabricating a semiconductor package according to some embodiments of the present inventive concepts, substrates may be bonded in a face-to-back fashion, and then a sawing process may be performed to simultaneously form a plurality of chip structures. Because the semiconductor package is formed of the same kind of semiconductor chip, it may be possible to simplify the method of fabricating the semiconductor package.

Although the present invention has been described in connection with the embodiments of the present invention illustrated in the accompanying drawings, it will be understood to those skilled in the art that various changes and modifications may be made without departing from the technical spirit and essential feature of the present invention. It therefore will be understood that the embodiments described above are just illustrative but not limitative in all aspects.

What is claimed is:

1. A semiconductor package, comprising:

a base semiconductor chip;

a chip structure mounted on the base semiconductor chip;

a connection terminal between the base semiconductor chip and the chip structure; and a molding layer on the base semiconductor chip, the molding layer surrounding the chip structure, wherein the chip structure includes:

a first semiconductor chip that includes a first circuit layer, a first protection layer, a first frontside pad in the first circuit layer, and a first backside pad in the first protection layer; and a second semiconductor chip on the first semiconductor chip, the second semiconductor chip including a second circuit layer, a second protection layer, a second frontside pad in the second circuit layer, and a second backside pad in the second protection layer, wherein a lateral surface of the first semiconductor chip is aligned with a lateral surface of the second semiconductor chip, wherein the first semiconductor chip includes a first integrated circuit in the first circuit layer, and the second semiconductor chip includes a second integrated circuit in the second circuit layer, the second integrated circuit being the same type as the first integrated circuit, wherein the first backside pad and the second frontside pad partially overlap each other when viewed in a plan view while being in direct contact with each other, and wherein the first backside pad and the second frontside pad include the same metal and are formed into a single unitary piece.

2. The semiconductor package of claim 1, wherein each of the first and second semiconductor chips includes an active surface and an inactive surface opposite to the active surface, wherein the first integrated circuit is on the active surface of the first semiconductor chip and the second integrated circuit is on the active surface of the second semiconductor chip, and wherein the inactive surface of the first semiconductor chip faces the active surface of the second semiconductor chip.

3. The semiconductor package of claim 1, wherein an integrated circuit of the base semiconductor chip is of a different type from the first integrated circuit of the first semiconductor chip and the second integrated circuit of the second semiconductor chip.

4. The semiconductor package of claim 1, wherein a lateral surface of the molding layer is vertically aligned with a lateral surface of the base semiconductor chip.

5. The semiconductor package of claim 1, further comprising a non-conductive layer between the chip structure and the base semiconductor chip.

6. The semiconductor package of claim 1, wherein a distance between the chip structure and the base semiconductor chip is in a range of 10 μm to 15 μm.

7. The semiconductor package of claim 1, wherein the connection terminal is between the base semiconductor chip and a bottom surface of the first frontside pad of the first semiconductor chip, and wherein the connection terminal includes a solder ball or a solder bump.

8. The semiconductor package of claim 1, wherein the chip structure includes a plurality of chip structures, and the plurality of chip structures are stacked in a vertical direction.

9. A semiconductor package, comprising:

a base semiconductor chip;

a chip structure mounted on the base semiconductor chip;

a connection terminal between the base semiconductor chip and the chip structure; and a molding layer on the base semiconductor chip, the molding layer surrounding the chip structure, wherein the chip structure includes:

a first semiconductor chip that includes a first circuit layer, a first protection layer, a first frontside pad in the first circuit layer, and a first backside pad in the first protection layer, and a second semiconductor chip on the first semiconductor chip, the second semiconductor chip including a second circuit layer, a second protection layer, a second frontside pad in the second circuit layer, and a second backside pad in the second protection layer, wherein a lateral surface of the first semiconductor chip is aligned with a lateral surface of the second semiconductor chip, wherein the first semiconductor chip includes a first integrated circuit in the first circuit layer, and the second semiconductor chip includes a second integrated circuit in the second circuit layer, the second integrated circuit being the same type as the first integrated circuit, wherein the first backside pad and the second frontside pad partially overlap each other when viewed in a plan view while being in direct contact with each other, wherein the first backside pad and the second frontside pad include the same metal and are formed into a single unitary piece, and wherein the second circuit layer of the second semiconductor chip directly contacts the first protection layer of the first semiconductor chip.

10. The semiconductor package of claim 9, wherein each of the first and second semiconductor chips includes an active surface and an inactive surface opposite to the active surface, wherein the first integrated circuit is on the active surface of the first semiconductor chip and the second integrated circuit is on the active surface of the second semiconductor chip, and wherein the inactive surface of the first semiconductor chip faces the active surface of the second semiconductor chip.

11. The semiconductor package of claim 9, wherein an integrated circuit of the base semiconductor chip is of a different type from the first integrated circuit of the first semiconductor chip and the second integrated circuit of the second semiconductor chip.

12. The semiconductor package of claim 9, wherein a lateral surface of the molding layer is vertically aligned with a lateral surface of the base semiconductor chip.

13. The semiconductor package of claim 9, further comprising a non- conductive layer between the chip structure and the base semiconductor chip.

14. The semiconductor package of claim 9, wherein a distance between the chip structure and the base semiconductor chip is in a range of 10 μm to 15 μm.

15. The semiconductor package of claim 9, wherein the connection terminal is between the base semiconductor chip and a bottom surface of the first frontside pad of the first semiconductor chip, and wherein the connection terminal includes a solder ball or a solder bump.

16. A semiconductor package, comprising:

a base semiconductor chip;

a chip structure mounted on the base semiconductor chip;

a connection terminal between the base semiconductor chip and the chip structure; and a molding layer on the base semiconductor chip, the molding layer surrounding the chip structure, wherein the chip structure includes:

a first semiconductor chip that includes a first circuit layer, a first protection layer, a first frontside pad in the first circuit layer, and a first backside pad in the first protection layer; and a second semiconductor chip on the first semiconductor chip, the second semiconductor chip including a second circuit layer, a second protection layer, a second frontside pad in the second circuit layer, and a second backside pad in the second protection layer, wherein a lateral surface of the first semiconductor chip is aligned with a lateral surface of the second semiconductor chip, wherein the first semiconductor chip includes a first integrated circuit in the first circuit layer, and the second semiconductor chip includes a second integrated circuit in the second circuit layer, the second integrated circuit being the same type as the first integrated circuit, wherein the first backside pad and the second frontside pad partially overlap each other when viewed in a plan view while being in direct contact with each other, wherein the first backside pad and the second frontside pad include the same metal and are formed into a single unitary piece, wherein a lower surface of the second frontside pad is coplanar with a lower surface of the second circuit layer, and wherein the second circuit layer directly contacts the first protection layer.

17. The semiconductor package of claim 16, wherein each of the first and second semiconductor chips includes an active surface and an inactive surface opposite to the active surface, wherein the first integrated circuit is on the active surface of the first semiconductor chip and the second integrated circuit is on the active surface of the second semiconductor chip, and wherein the inactive surface of the first semiconductor chip faces the active surface of the second semiconductor chip.

18. The semiconductor package of claim 16, wherein an integrated circuit of the base semiconductor chip is of a different type from the first integrated circuit of the first semiconductor chip and the second integrated circuit of the second semiconductor chip, and wherein a distance between the chip structure and the base semiconductor chip is in a range of 10 μm to 15 μm.

19. The semiconductor package of claim 16, wherein a lateral surface of the molding layer is vertically aligned with a lateral surface of the base semiconductor chip.

20. The semiconductor package of claim 16, further comprising a non-conductive layer between the chip structure and the base semiconductor chip.

* * * * *